United States Patent
Stathakis et al.

(10) Patent No.: US 11,089,717 B2
(45) Date of Patent: Aug. 10, 2021

(54) RECONFIGURABLE STORAGE THERMAL DISSIPATION

(71) Applicant: International Business Machines Corporation, Armonk, NY (US)

(72) Inventors: Karl Stathakis, Owatonna, MN (US); Brent William Yardley, Hillsboro, OR (US); Curtis Eugene Larsen, Eden Valley, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/454,125

(22) Filed: Jun. 27, 2019

(65) Prior Publication Data

US 2020/0413568 A1  Dec. 31, 2020

(51) Int. Cl.
  *H05K 7/20* (2006.01)
(52) U.S. Cl.
  CPC ..... *H05K 7/20418* (2013.01); *H05K 7/20436* (2013.01)
(58) Field of Classification Search
  CPC .................. H05K 7/20418; H05K 7/20436
  See application file for complete search history.

(56) References Cited

U.S. PATENT DOCUMENTS

| | | | |
|---|---|---|---|
| 5,596,483 A | 1/1997 | Wyler | |
| 5,927,386 A | 7/1999 | Lin | |
| 6,185,097 B1 | 2/2001 | Behl | |
| 6,373,696 B1 | 4/2002 | Bolognia et al. | |
| 7,292,441 B2 | 11/2007 | Smalc et al. | |
| 8,184,439 B2 | 5/2012 | Baek et al. | |
| 8,325,474 B2 | 12/2012 | Spaulding et al. | |
| 8,787,022 B2 | 7/2014 | Moriai et al. | |
| 9,739,543 B2* | 8/2017 | Yi | H01L 23/40 |
| 10,582,644 B1* | 3/2020 | Hur | H05K 7/20409 |
| 10,624,240 B2* | 4/2020 | Leigh | G02B 6/4269 |

FOREIGN PATENT DOCUMENTS

| | | |
|---|---|---|
| CN | 204577101 U | 8/2015 |
| CN | 207676260 U | 7/2018 |

OTHER PUBLICATIONS

Stathakis et al., "Storage Device", Design U.S. Appl. No. 29/696,341, filed Jun. 27, 2019.
List of IBM Patents or Patent Applications Treated as Related, dated Jun. 26, 2019, 2 pages.

* cited by examiner

*Primary Examiner* — Rockshana D Chowdhury
(74) *Attorney, Agent, or Firm* — Nolan M. Lawrence

(57) ABSTRACT

A storage device includes a bottom surface, a plurality of sides, and a top surface. The top surface integrally couples to the plurality of sides. The bottom surface, the plurality of sides, and the top surface form an outer surface of the storage device. The top surface, when coupled to the bottom surface, contacts one or more internal components of the storage device. The top surface comprises a plurality of finned ridges and a smooth continuous mounting surface. The plurality of finned ridges protrudes away from the outer surface of the storage device. The plurality of finned ridges is formed to direct heat away from the storage device. The smooth continuous mounting surface is configured to accept attachment of a thermal dissipation module.

20 Claims, 7 Drawing Sheets

RECONFIGURABLE STORAGE THERMAL DISSIPATION

BACKGROUND

The present disclosure relates to storage devices, and more specifically, to thermal dissipation of storage devices.

Storage devices may be a foundational component of computer systems. Storage devices may operate within computer systems as secondary storage to save data for longer periods of time than primary storage (e.g., memory, or cache). Storage devices may be in the form a drive (e.g., a hard disk drive, a solid-state drive) including an external casing and internal components, such as data components and logic components. Data components may be disks or solid-state memory chips. Logic components may include controllers or processors configured to send and receive data between computer systems and to store and retrieve data in the data components.

SUMMARY

According to embodiments of the present disclosure, a storage device capable of providing reconfigurable thermal dissipation capabilities. The storage device includes a bottom surface, a plurality of sides, and a top surface. The top surface integrally couples to the plurality of sides. The bottom surface, the plurality of sides, and the top surface form an outer surface of the storage device. The top surface, when coupled to the bottom surface, contacts one or more internal components of the storage device. The top surface comprises a plurality of finned ridges and a smooth continuous mounting surface. The plurality of finned ridges protrudes away from the outer surface of the storage device. The plurality of finned ridges is formed to direct heat away from the storage device. The smooth continuous mounting surface is configured to accept attachment of a thermal dissipation module.

According to additional embodiments, disclosed is a storage device capable of providing reconfigurable thermal dissipation capabilities. The storage device includes a bottom surface, a plurality of sides, and a top surface. The plurality of sides integrally couples to the bottom surface. The bottom surface, the plurality of sides, and the top surface form an outer surface of the storage device. The top surface, when coupled to the plurality of sides, contacts one or more internal components of the storage device. The top surface comprises a plurality of finned ridges and a smooth continuous mounting surface. The plurality of finned ridges protrudes away from the outer surface of the storage device. The plurality of finned ridges is formed to direct heat away from the storage device. The smooth continuous mounting surface is configured to accept attachment of a thermal dissipation module.

According to yet further embodiments, disclosed is a storage device capable of providing reconfigurable thermal dissipation capabilities. The storage device includes a bottom surface, a plurality of sides, and a top surface. The bottom surface, the plurality of sides, and the top surface form a storage device casing. The casing of the storage device is configured to affix one or more internal components of the storage device within the casing. The top surface is configured to thermally couple to the one or more internal components of the storage device. The top surface comprises a plurality of finned ridges and a smooth continuous mounting surface. The plurality of finned ridges protrudes away from the outer surface of the storage device. The plurality of finned ridges is formed to direct heat away from the storage device. The smooth continuous mounting surface is configured to accept attachment of a thermal dissipation module.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
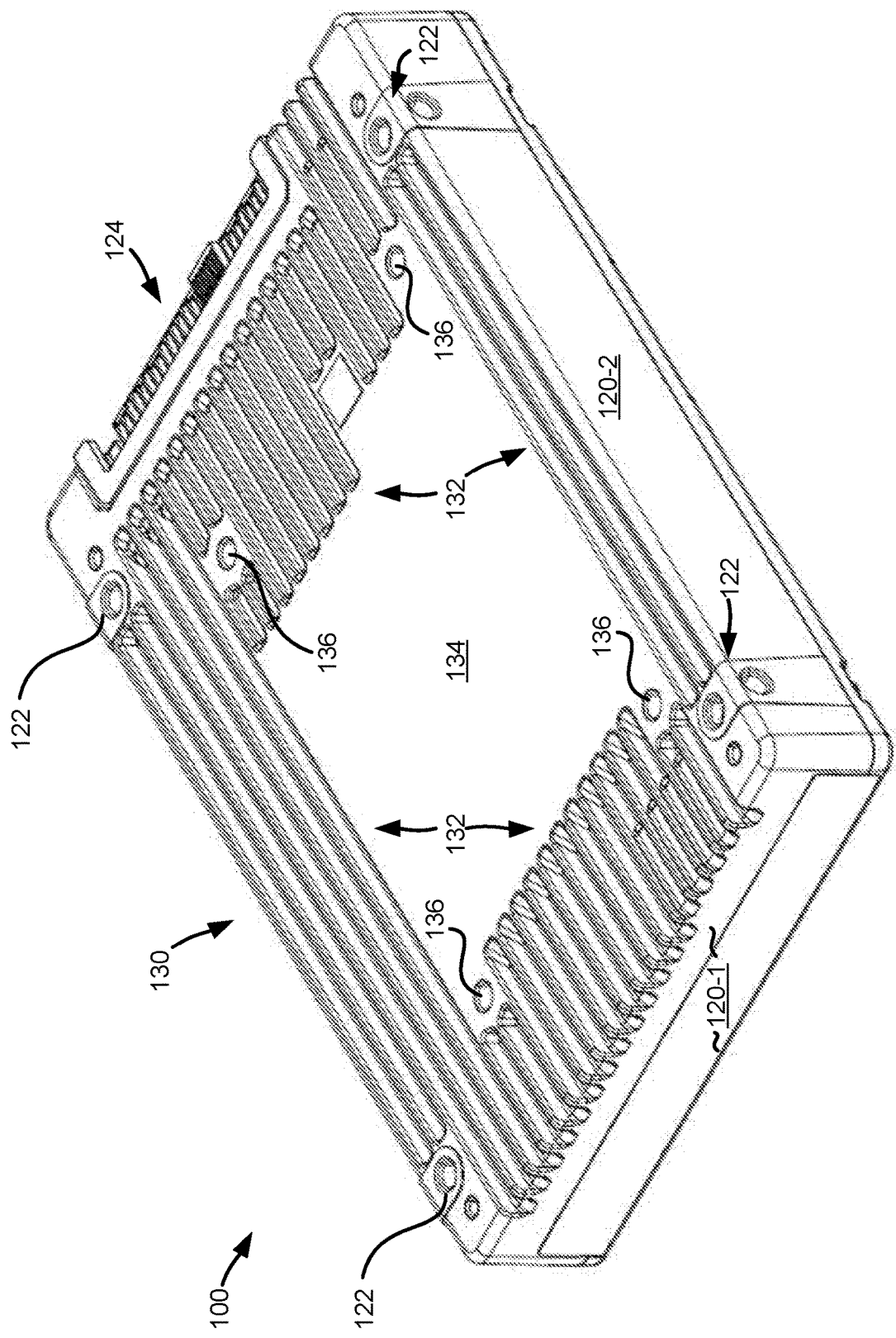
FIG. 1A depicts a top surface of a storage device with reconfigurable integrated thermal management, consistent with some embodiments of the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to storage devices, more particular aspects relate to thermal dissipation of storage devices. While the present disclosure is not necessarily limited to such applications, various aspects of the disclosure may be appreciated through a discussion of various examples using this context.

The thermal requirements for storage devices necessitate a solution for dissipating heat from the various data components and logic components. A cooling enclosure is one solution for dissipating heat from storage devices. A cooling enclosure may be a device that surrounds a casing of a storage device and is configured to thermally dissipate heat generated from the storage device. Unfortunately, storage devices are designed at industry-standard sizes. Further, other componentry and devices of computers are also designed around industry standard sizes of computers (e.g., 2.5 inches, 3.5 inches). For example, computers and computing devices sized to accept computer devices may include the following: servers, computer chassis, blade servers, storage racks, and network attached storage devices. Consequently, an enclosure for thermal dissipation of a storage device would not be useful in most servers and computer cases.

Another solution may be a storage device with external casing having fixed integrated heat dissipation (e.g., heat sink, heat exchanger, fins). Unfortunately, designing a storage device casing with fixed cooling has a few potential drawbacks. First, optimizing cooling for a first use-case may be unoptimized for a second use-case. For example, a server environment and a workstation environment may have different access patterns and requirements for internal components of the storage device may be unoptimized in either environment. Second, a tradeoff must be made with a fixed integrated heat dissipation between thermal dissipation and size compatibility. For example, a standard sized storage device may require a fixed length, width, and height. A storage device having a fixed integrated heat dissipation casing may not adequately dissipate thermal energy while being standard size compatible. However, a storage device having a fixed integrated heat dissipation casing with sufficient thermal dissipation performance may not dimensionally fit within a standard size form factor.

Figure 1B:
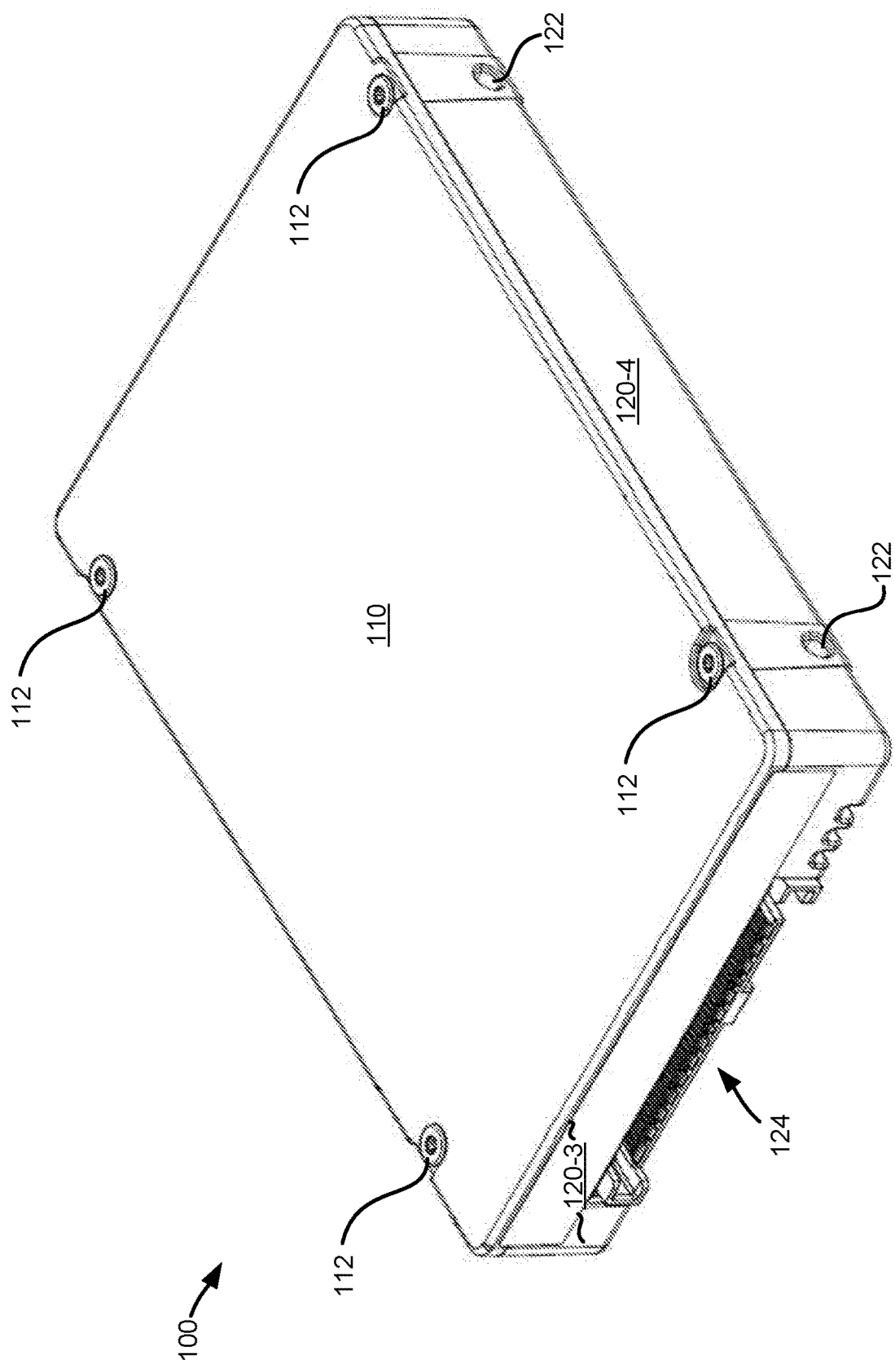
FIG. 1B depicts a bottom surface of a storage device with reconfigurable integrated thermal management, consistent with some embodiments of the disclosure.

FIG. 1A and FIG. 1B depict a storage device 100 with reconfigurable integrated thermal management, consistent with some embodiments of the disclosure. Storage device 100 may be of a standards-based size (e.g., a 2.5-inch drive, a 3.5-inch drive). Storage device 100 may be capable of operating without any additional thermal dissipation modules. This may provide advantages over existing solutions that do not provide cooling without surrounding or covering an entire storage device. For example, storage device 100 may function and operate in desktop workstations, or personal electronics devices where physical dimensions are limited.

Storage device 100 may be a solid-state storage device. Storage device 100 may be a magnetic disk storage device. Storage device 100 includes the following: a bottom surface 110; a plurality of sides 120-1, 120-2, 120-3, and 120-4 (collectively, 120); and a top surface 130. The bottom surface 110, the plurality of sides 120, and the top surface 130 may form a casing of the storage device 100. The terms bottom and top are used for explanatory purposes only. Some embodiments contemplate a storage device in a different orientation where the bottom surface is a top and the top surface is a bottom.

Without an additional thermal dissipation module, storage device 100 may operate within a standards-based server or network-attached storage device. With an additional thermal dissipation module coupled to the casing of storage device 100, a portion of the storage device may be partially or completely covered. For example, a thermal dissipation module may be attached to one of the following: the bottom surface 110, the plurality of sides 120, or the top surface 130. This may provide advantages to existing cooling devices as the storage device 100 may only be minimally impacted. For example, an additional thermal dissipation module may only increase one dimension of a length, width, or height of the storage device 100; but not multiple of the length, width, or height dimensions.

FIG. 1A depicts a top surface 130 of a storage device 100 with reconfigurable integrated thermal management, consistent with some embodiments of the disclosure. FIG. 1A may also depict two of the sides 120-1 and 120-2. Storage device 100 further includes a plurality of system mounts 122 for affixing the storage device to a computer system. The system mounts 122 may be configured to accept pins, rods, dowels, screws, or other elements designed to secure the storage device (e.g., to minimize movement of storage device 100, to dampen vibration or audible quiet storage device 100, to affix within a computer system). The system mounts 122 may be located on the plurality of sides 120. The system mounts 122 may be located on the top surface 130. In some embodiments, certain system mounts 122 may be located on both the sides 120 and the top surface 130.

The top surface 130 may include a plurality of finned ridges 132. The finned ridges 132 may extend upwards and away from the top surface 130. In some embodiments, the top surface 130 may include a plurality of channels etched into the top surface that extend inwards and away from the top surface. The finned ridges 132 may provide for an integrated heat sink that dissipates thermal energy created by the internal components of storage device 100. For example, the finned ridges 132 may provide an increased surface area for increased cooling effects. The finned ridges 132 may all be aligned in a single direction to maximize airflow. For example, a computer system may have an internal fan (not depicted) directing airflow in a first direction towards the storage device 100. The finned ridges 132 may all be aligned to maximize the dissipation effect of the directed airflow from the internal fan.

Top surface 130 may also include a smooth continuous surface 134. The smooth continuous surface 134 may be shaped to physically accept a thermal dissipation module (not depicted) that is attached to the storage device 100. The thermal dissipation module may be attached directly such that a surface of the thermal dissipation module is in direct contact with the smooth continuous surface. In some embodiments, the thermal dissipation module may be attached indirectly. For example, smooth continuous surface 134 may be coated with a thermal interface material before being attached to the thermal dissipation module. Top surface 130 may also include one or more mounts 136 for securing a thermal dissipation module to the storage device 100. The mounts 136 may be shaped to accept pins, screws, clips, or other securing devices for securing the thermal dissipation module to the storage device. The mounts 136 may extend inward towards the bottom surface 110. The smooth continuous surface 134 may be surrounded by the finned ridges 132 (as depicted in FIG. 1A).

FIG. 1B depicts a bottom surface 110 of a storage device 100 with reconfigurable integrated thermal management, consistent with some embodiments of the disclosure. The bottom surface 110 may be a generally flat shape and may be considered a flat bottom surface. Bottom surface 110 may be integrally coupled to and form a part of the sides 120. In some embodiments, the bottom surface 110 may be separate from the plurality of sides 120. For example, the sides 120 may be integrally couple to form part of the top surface 130.

In some embodiments, the bottom surface 110, the plurality of sides 120 and the top surface 130 may all be separate components that are not integrally coupled. For example, the bottom surface 110 may be shaped to physically couple to the sides 120 and the sides may be shaped to physically couple to the top surface 130 to form a casing surrounding the internal components of the storage device 100. The bottom surface 110 may also include holes for the passage of fasteners (e.g., pins or rivets) to secure the bottom surface 110 to the other components of the storage device. Storage device 100 may also include one or more internal components (not depicted), and a connector 124. Connector 124 may be configured to perform communication between storage device 100 and a computer system (not depicted). Connector 124 may be configured to receive electrical power from a computer system (not depicted) and provide the received electrical power to storage device 100.

Figure 2A:
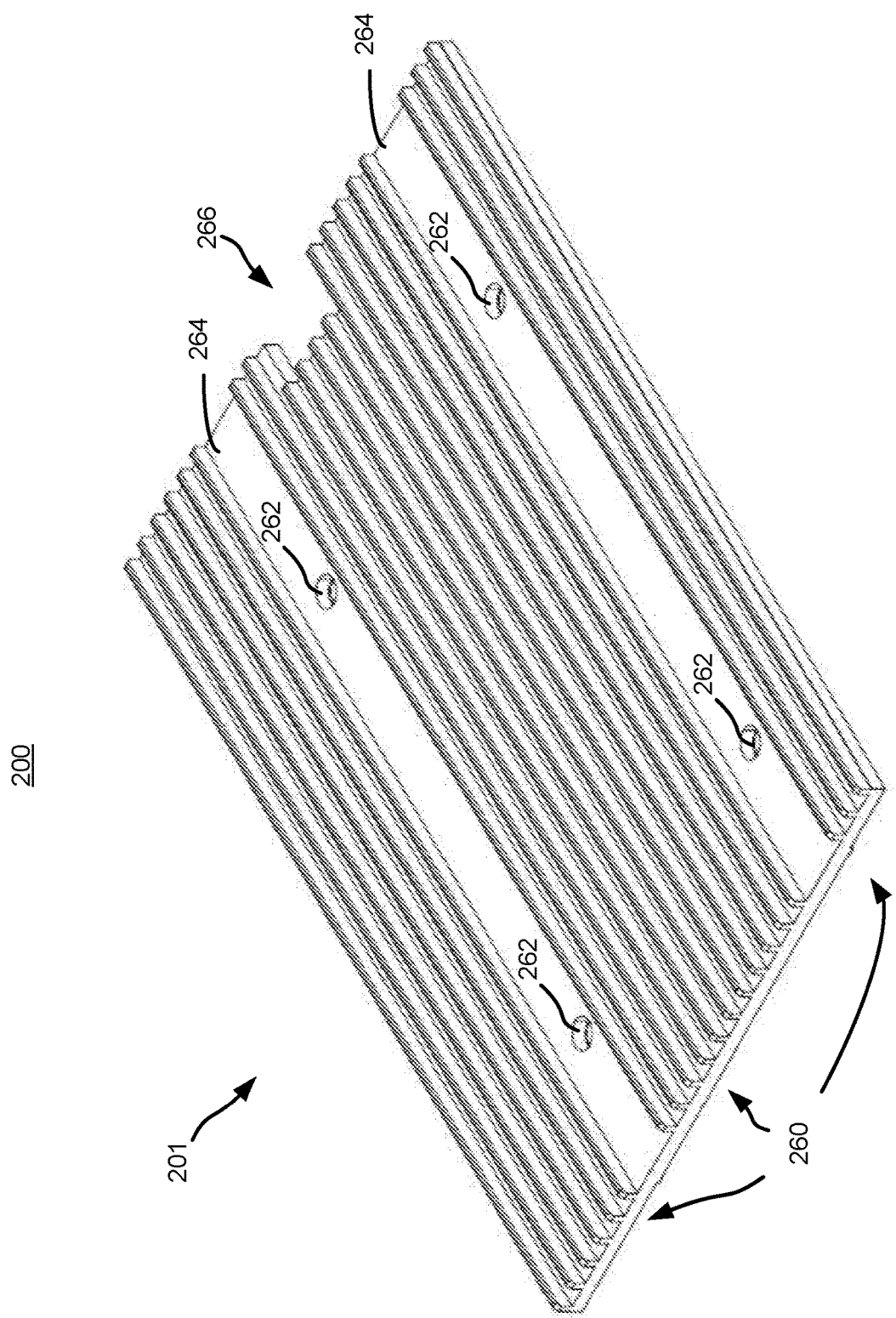
FIG. 2A depicts a top side of a thermal dissipation module configured to dissipate heat from a storage device, consistent with some embodiments of the disclosure.
Figure 2B:
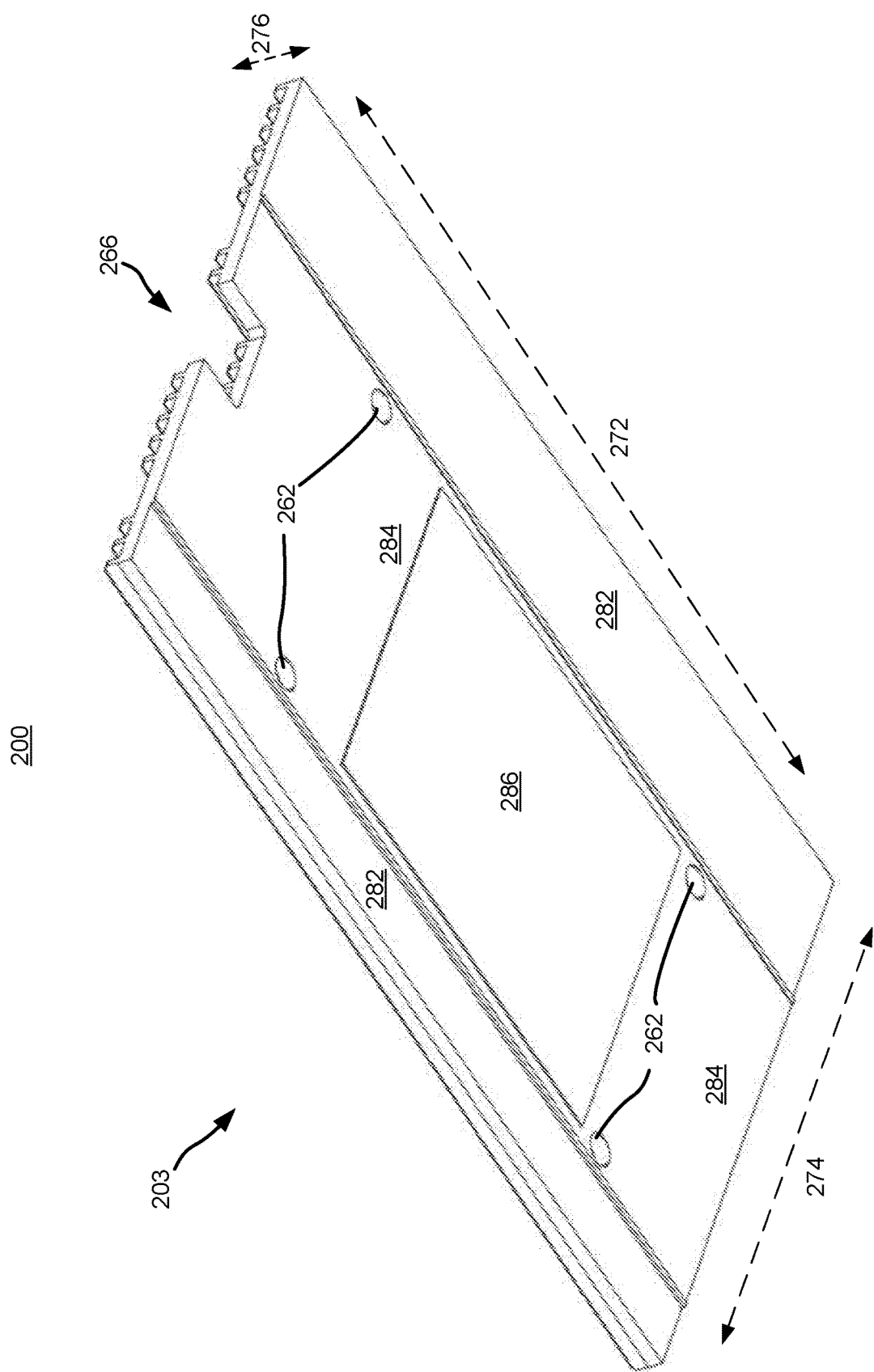
FIG. 2B depicts a bottom side of a thermal dissipation module configured to dissipate heat from a storage device.

FIG. 2A and FIG. 2B depict a thermal dissipation module 200 designed to be attached to a reconfigurable storage device, consistent with some embodiments of the disclosure. Thermal dissipation module 200 may be used in various computer systems such as 2.5 drives in standard pitch (17-18 mm) drive bays and with customer pitch (for example, storage drawers at 20-25 mm pitch) server racks. FIG. 2A depicts a top side 201 of a thermal dissipation module 200 configured to dissipate heat from a storage device, consistent with some embodiments of the disclosure. Thermal dissipation module 200 may include a secondary heat sink 260.

Secondary heat sink 260 may, upon being coupled to a storage device, further assist in directing heat away from the storage device. For example, secondary heat sink 260 may include a plurality of fins that, upon being coupled to a storage device, extend away from a casing of the storage device. Some embodiments contemplate a thermal dissipation module 200 configured to dissipate heat using other techniques.

Some embodiments contemplate a thermal dissipation module configured to operate differently than a heat sink. For example, thermal dissipation module 200 may be configured to operate as a heat exchanger. The heat exchanger may be configured with piping or sealed channels that are filled with a gas or a fluid capable of carrying heat away from the storage device. In embodiments, the fluid could include any of the following: deionized water, inhibited glycol solution, or dielectric fluids.

The thermal dissipation module 200 may also include the following: one or more secondary mounts 262; a pair of flat runners 264; and component notch 266. The secondary mounts 262 may include one or more mounts may permit a fastener (e.g., a pin, screw, bracket, or other mounting element) to pass through the top side 201 of the thermal dissipation module 200. The secondary mounts 262 in combination with a mounting element permanently attach the thermal dissipation module 200 to a storage device. The flat runners 264 permit the coupling of additional dissipation modules (e.g., a fan, a tertiary heat sink). The component notch 266 may be a cutout, divot, or other irregularity in shape configured to permit one or more components to be coupled to a storage device. For example, component notch 266 may be a relief designed to allow coupling a serial connector to a storage device for connecting power and data transmission to a computer system.

FIG. 2B depicts a bottom side 203 of a thermal dissipation module 200 configured to dissipate heat from a storage device. From the bottom side 203 similar components of thermal dissipation module 200 may be viewed. For example, from bottom side 203 the secondary mounts 262 and the component notch 266 may be viewed. Thermal dissipation module 200 may be configured based on a size defined by a length 272, a width 274, and a height 276. The size of the thermal dissipation module may be similar or share common dimensions with a storage device. For example, an example storage device may be a 2.5-inch form factor hard drive that has a length of approximately 100 millimeters and a width of approximately 69 millimeters. Thermal dissipation module 200 may also have a length 272 of 100 millimeters and a width of 69 millimeters.

In some embodiments, thermal dissipation module 200 may have a reduced dimensionality compared to a storage device. In a first example, thermal dissipation module has a length 272 of 100 millimeters and a width 274 of 53.7 millimeters. In a second example, thermal dissipation module has a length 272 of 70 millimeters and a width 276 of 69.85 millimeters. Likewise, the height 276 of thermal dissipation module 200 may vary. In a first example, a thermal dissipation module 200 may have a height 276 of 10 millimeters or less. In a second example, a thermal dissipation module 200 may have a height 276 of 33 millimeters or more. The ability to configure a storage device with thermal dissipation modules that vary in a height dimension may provide advantages such that a storage device may be reconfigured many times to take into consideration thermal performance and installation height restrictions.

The bottom side 203 of thermal dissipation module 200 may also depict other features. For example, a first surface 282, a second surface 284, and a third surface 286. The various surfaces 282, 284, and 286 of the bottom side 203 of thermal dissipation module 200 may have variance along the height dimension 276, such that the various surfaces are stepped in configuration. For example, first surface 282 may be of a lesser height than second surface 284 and second surface 284 may be of a lesser height than third surface 286. This stepped configuration may provide for an air gap when coupled to a storage device. Third surface 286 may be finished with a different finish than that of first surface 282 and second surface 284. For example, third surface 286 may be finished using a polish, rub, abrasion, or other relevant technique designed to smooth out the third surface. Third surface 286 may be smoothed out or otherwise configured to accept a layer of thermal interface material (not depicted) applied for thermal coupling to a portion of a storage device.

Figure 3A:
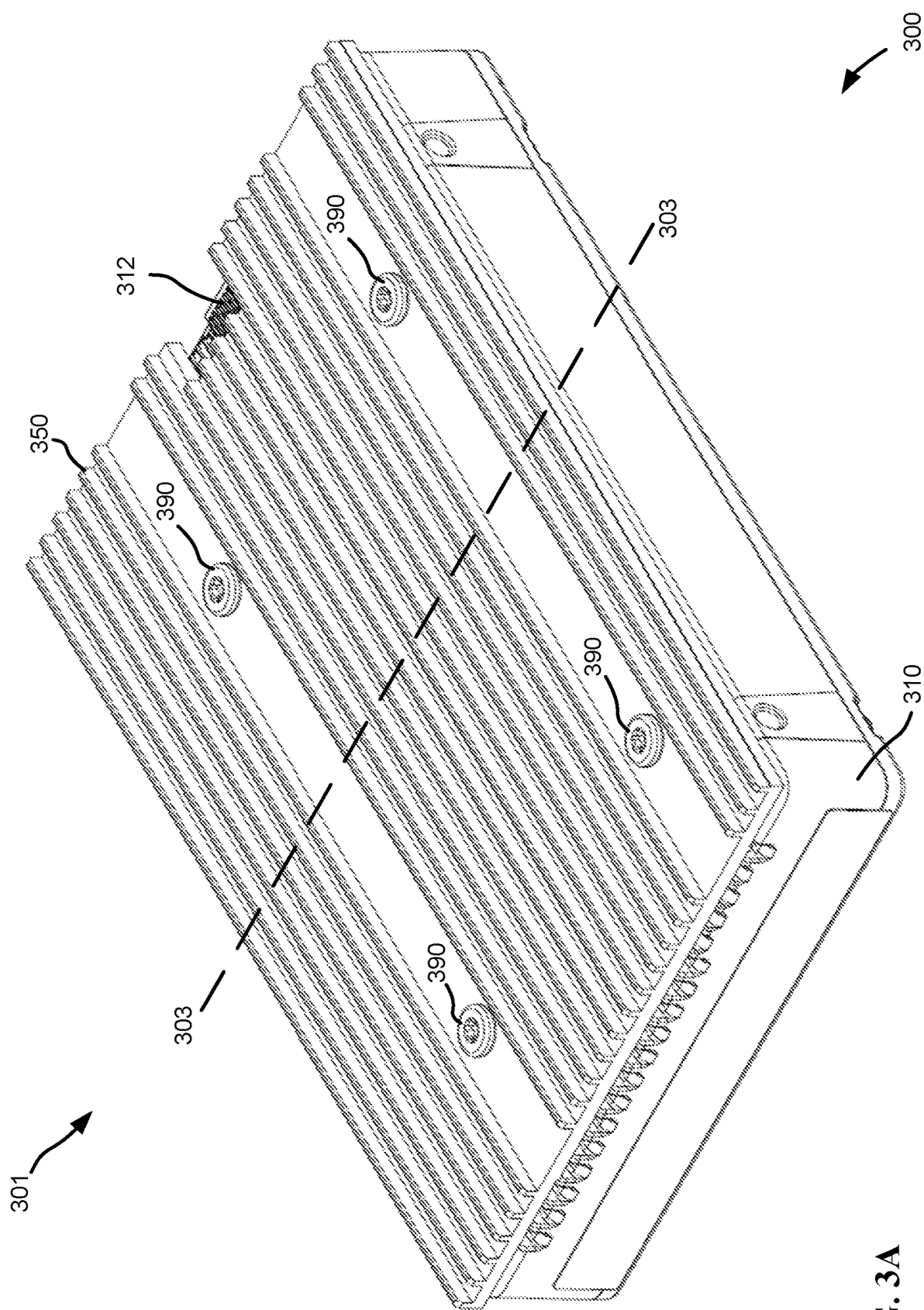
FIG. 3A depicts a top side of a storage system configured with additional thermal dissipation capacity, consistent with some embodiments of the disclosure . . . .
Figure 3B:
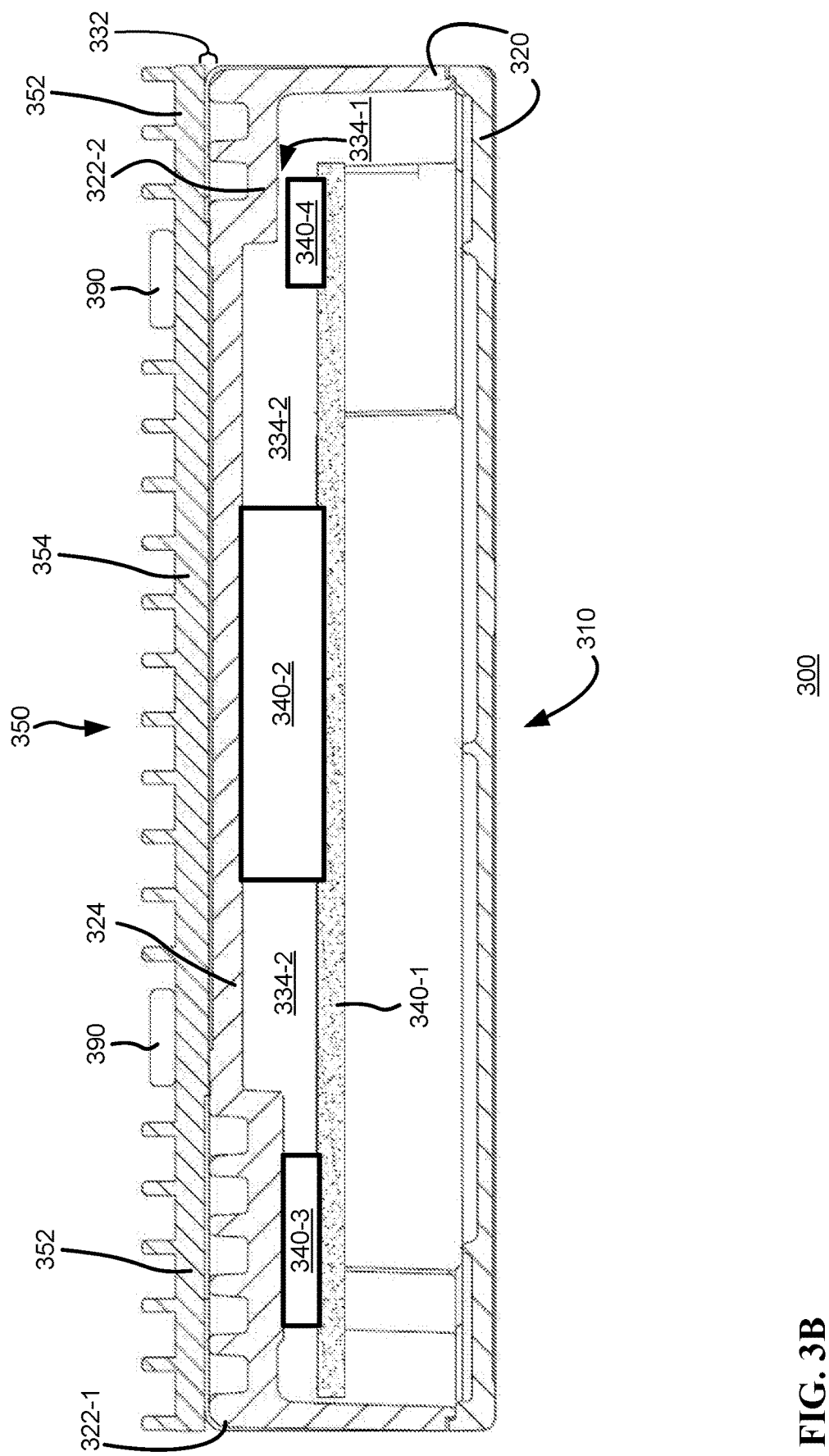
FIG. 3B depicts a cross-sectional view of storage system, consistent with some embodiments of the disclosure.

FIG. 3A and FIG. 3B depict a storage system 300 including a storage device 310 and an attached a thermal dissipation module 350, consistent with some embodiments of the disclosure. FIG. 3A depicts a top side 301 of a storage system 300 configured with additional thermal dissipation capacity, consistent with some embodiments of the disclosure. Storage system 300 includes a storage device 310 for performing secondary storage of a computer system (not depicted). Storage device 310 may be a disk drive, a solid-state drive, or any other secondary storage capable of consumer in the range of twelve to thirty watts. Storage device 310 may include a connector 312 for communicatively and electrically connecting to a computer system. Storage system 300 also includes thermal dissipation module 350 attached to storage device 310.

As attached, thermal dissipation module 350 may be configured to dissipate heat from one or more internal components (not depicted) of storage device 310. Thermal dissipation module 350 may be shaped to facilitate various functionality of storage device 310. For example, thermal dissipation module 350 may be notched or irregularly shaped on one or more sides to accept a cord (not depicted) physically coupled to connector 312 of storage device 310. Thermal dissipation module 350 may be attached to storage device 310 with a plurality of mounting elements 390. The mounting elements 390 may be a relevant physical component configured to attach thermal dissipation module 350, such as pins, screws, rivets, clips.

FIG. 3B depicts a cross-sectional view of storage system 300, consistent with some embodiments of the disclosure. Cross-sectional view may be along cut line 303 of FIG. 3A. Storage device 310 may comprise a top surface having a plurality of fins 322-1 and 322-2 (collectively, 322) and a continuous surface 324. The plurality of fins 322 may be configured as ridges or raised portions with increased surface area to dissipate heat from storage device 310. The continuous surface 324 may be smoothed or polished and, in some embodiments, configured to accept thermal interface material.

Thermal dissipation module 350 may comprise a first section 352 and a second section 354. The first section 352 may be of a lesser thickness than the second section 354. The variance in thickness between the first section 352 and the second section 354 may create an external air gap 332 between the thermal dissipation module 350 and the storage device 310. For example, air gap 332 may allow for a gas to pass over fins 322-1 and 322-2 of storage device 310 and underneath first section 352 of thermal dissipation module 350.

Storage device 310 may include a plurality of internal components 340-1, 340-2, 340-3, and 340-4 (collectively 340). Internal component 340-1 may be a printed circuit board or other logic board for physically securing and communicatively coupling the various internal components 340. Internal component 340-2 may be a controller or integrated circuit, such as a field programmable gate array or application specific integrated circuit. Internal component 340-3 may be a storage, such as a solid-state memory module, stacked memory module, or other relevant storage. Internal component 340-4 may be a capacitor configured to account for and smooth out variations in electronic current or voltage.

The fins 322 and continuous surface 324 may form part of a casing 320. The casing 320 may surround or otherwise encompass the internal components 340 of storage device 310. By surrounding the internal components 340, the internal components 340 may be shielded from fluid, dust, or other contaminants. The casing 320 may vary in thickness and shape such that one or more of the various internal components 340 may or may not have physical contact with the casing. For example, fins 322-1 may be of a greater thickness than fins 322-2. The greater relative thickness of fins 322-1 may be designed to physically contact internal component 340-3 and provide for better heat dissipation regardless of the configuration of storage system 300.

The various in thickness may, also create one or more internal air gaps 334-1 and 334-2 (collectively 334). The internal air gaps 334 may allow for isolation of the thermal output of the various internal components. For example, the lesser relative thickness of fins 322-2 may provide for internal air gap 334-1 between fins 322-2 and internal component 340-4. In another example, continuous surface 324 may be internally raised in comparison to fins 322-1 and fins 322-2 to create airgap 334-2 between internal component 340-2 and internal components 340-3 and 340-4.

Figure 4:
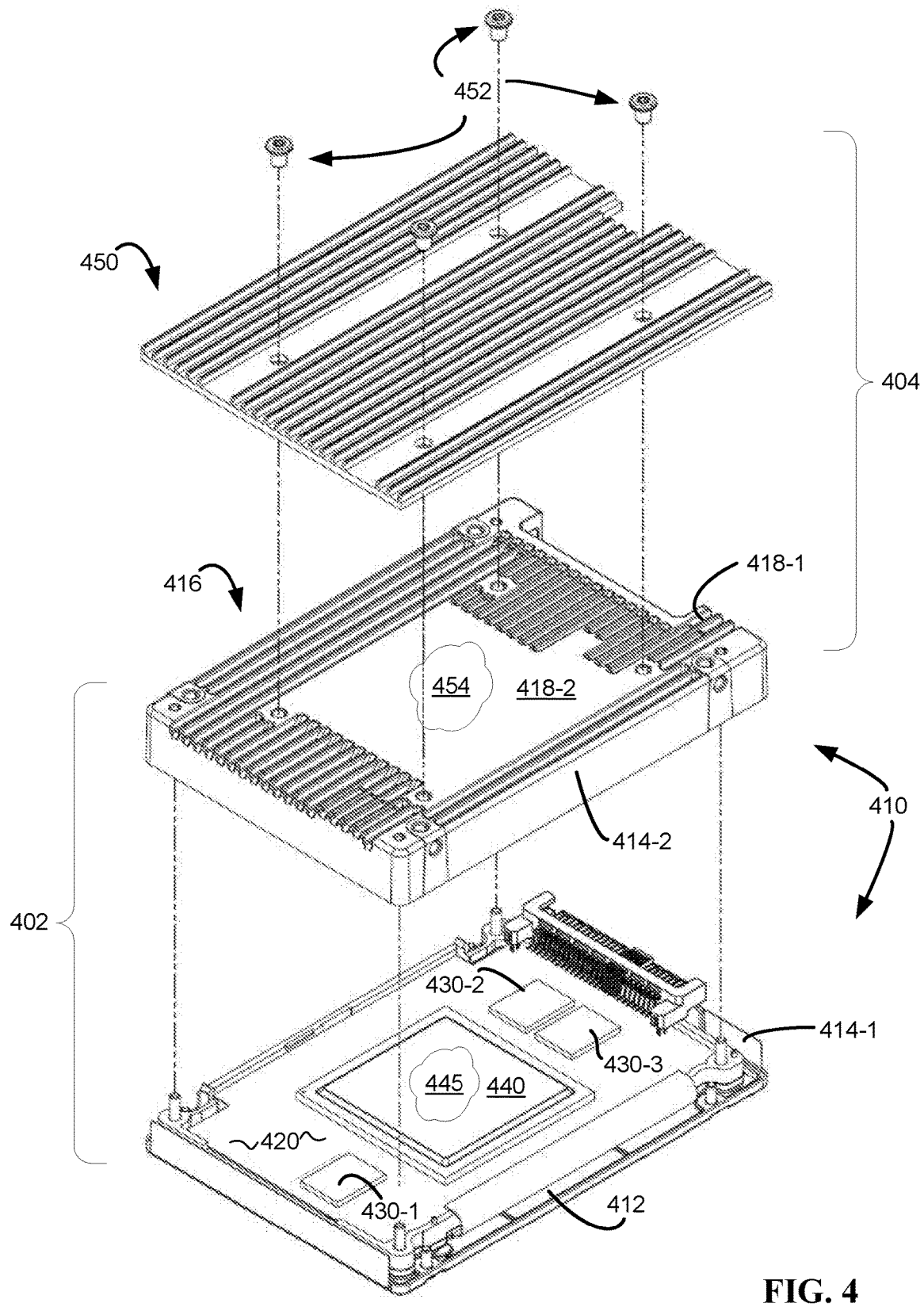
FIG. 4 depicts an exploded view of a storage system consistent with some embodiments of the disclosure.

FIG. 4 depicts an exploded view of a storage system 400 consistent with some embodiments of the disclosure. Storage system 400 may include a storage casing 410 that comprises: a bottom surface 412; a plurality of sides, including sides 414-1 and 414-2 (collectively, 414); and a generally top surface 416. The top surface 416 may comprise a plurality of finned ridges 418-1 and a smooth continuous surface 418-2. The plurality of finned ridges 418-1 may surround the smooth continuous surface 418-2 along the top surface 416. In some embodiments, the smooth continuous surface 418-2 extends outward widthwise or lengthwise such that the plurality of finned ridges 418-1 may not surround the smooth continuous surface.

The bottom surface 412 is shaped to protect and house a plurality of internal components 430-1, 430-2, 430-3 (collectively 430) and a controller 440. The internal components 430 and the controller 440 may be affixed to a circuit board 420. At a time 402 the bottom surface 412, the plurality of sides 414, and the top surface 416 may be affixed together. During the affixing at 402, the controller 440 may be covered with a thermal interface material 445. The thermal interface material 445 may thermally couple the smooth continuous surface 418-2 and the controller 440. Time 402 may be before the storage system 400 is shipped to a customer (e.g., during manufacturing).

A thermal dissipation module 450 may be installed or attached, or otherwise affixed to storage casing 410 at a time 404. Time 404 may be after time 402, such as when storage system 400 is first installed at a customer site. Thermal dissipation module 450 may be installed with one or more detachable snaps 452, though threaded screws are also contemplated. At time 402, a thermal interface material 454 may be installed onto smooth continuous surface 418-2 and the underside of thermal dissipation module 450. Upon securing with the detachable snaps 452, the thermal interface material 454 may form a thin bond line to thermally couple the controller 440 to the thermal dissipation module 450.

In some embodiments, the circuit board 420, the internal components 430, or the controller 440 may be customized for installation into the storage casing 410. For example, the storage casing 410 may be shaped such that a portion of the storage casing (e.g., the top surface 416) protrudes internally into the interior to facilitate attachment with the detachable snaps 452. The shape of the storage casing 410 may not be compatible with a standard storage device (e.g., a disk drive, a solid-state storage drive). Consequently, the shape or depth of the circuit board 420 may be altered. Likewise, the internal components 430 and the controller 440 may also be altered in shape (or location on the circuit board 420).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A storage device storage device comprising:
   a bottom surface;
   a plurality of sides; and
   a top surface,
   wherein the top surface integrally couples to the plurality of sides,
   wherein the bottom surface, the plurality of sides, and the top surface form an outer surface of the storage device,
   wherein the top surface, when coupled to the bottom surface, contacts one or more internal components of the storage device,
   the top surface comprising:
      a plurality of finned ridges protruding away from the outer surface of the storage device, the plurality of finned ridges formed to direct heat away from the storage device, wherein the plurality of finned ridges is integrally formed to the top surface, wherein the plurality of finned ridges is in a single plane; and
      a smooth continuous mounting surface, the smooth continuous mounting surface configured to accept attachment of a thermal dissipation module, wherein the smooth continuous mounting surface is integrally formed to the top surface, wherein the smooth continuous surface is in the single plane.

2. The storage device of claim 1, wherein the thermal dissipation module includes a secondary heat sink for directing heat away from the storage device.

3. The storage device of claim 2, wherein the top surface includes a first width and a first length,
and wherein the smooth continuous surface includes a second width and a second length,
and wherein the second width is less than the first width and the second length is less than the first length.

4. The storage device of claim 3, wherein the secondary heat sink includes a third width and a third length, and wherein the third width is equal to the first width, and wherein the third length is equal to the first length.

5. The storage device of claim 3, wherein the secondary heat sink includes a third width and a third length, and wherein the third width is equal to the second width, and wherein the third length is equal to the second length.

6. The storage device of claim 1, wherein a first vertical side of the plurality of sides includes a power connector configured to supply power to the storage device.

7. The storage device of claim 1, wherein a first vertical side of the plurality of sides includes a data connector configured to communicatively couple the storage device to a client device.

8. The storage device of claim 1, wherein the top surface further comprises one or more mounts to facilitate attachment of the thermal dissipation module.

9. The storage device of claim 1, wherein the plurality of finned ridges of the top surface surround the smooth continuous mounting surface.

10. The storage device of claim 1, wherein the smooth continuous mounting surface is further configured to accept thermal interface material before the attachment of the thermal dissipation module.

11. The storage device of claim 1, wherein the thermal dissipation module is a heat sink.

12. The storage device of claim 1, wherein the thermal dissipation module is a heat exchanger.

13. A storage device capable of providing reconfigurable thermal dissipation capabilities, the storage device comprising:
a bottom surface;
a plurality of sides,
wherein the plurality of sides integrally couples to the bottom surface; and
a top surface,
wherein the bottom surface, the plurality of sides, and the top surface form an outer surface of the storage device, the top surface comprising:
a plurality of finned ridges protruding away from the outer surface of the storage device, the plurality of finned ridges formed to direct heat away from the storage device, wherein the plurality of finned ridges is integrally formed to the top surface; and
a smooth continuous mounting surface, the continuous mounting surface configured to accept attachment of a thermal dissipation module, wherein the smooth continuous mounting surface is integrally formed to the top surface, wherein the smooth continuous mounting surface faces away from the bottom surface
wherein a second smooth continuous surface of the top surface faces the bottom surface, wherein the second smooth continuous surface, when coupled to the plurality of sides, directly contacts one or more internal components of the storage device.

14. The storage device of claim 13, wherein a first vertical side of the plurality of sides includes a power connector configured to supply power to the storage device.

15. The storage device of claim 13, wherein a first side of the plurality of sides includes a data connector configured to communicatively couple the storage device to a client device.

16. The storage device of claim 13, wherein the top surface further comprises one or more mounts to facilitate attachment of the thermal dissipation module.

17. A storage device capable of providing reconfigurable thermal dissipation capabilities, the storage device comprising:
a bottom surface;
a plurality of sides; and
a top surface,
wherein the bottom surface, the plurality of sides, and the top surface form a storage device casing, the storage device casing configured to affix one or more internal components of the storage device within the storage device casing,
wherein the top surface is configured to thermally couple to the one or more internal components of the storage device,
the top surface comprising:
a plurality of finned ridges protruding away from the storage device casing, the plurality of finned ridges formed to direct heat away from the storage device; and
a smooth continuous mounting surface, the continuous mounting surface configured to accept attachment of a thermal dissipation module, wherein the smooth continuous mounting surface is flush with the plurality of finned ridges.

18. The storage device of claim 17, wherein the thermal dissipation module includes a secondary heat sink for directing heat away from the storage device.

19. The storage device of claim 18, wherein the top surface includes a first width and a first length,
and wherein the smooth continuous surface includes a second width and a second length,
and wherein the second width is less than the first width and the second length is less than the first length.

20. The storage device of claim 19, and wherein the secondary heat sink includes a third width and a third length, and wherein the third width is equal to the first width, and wherein the third length is equal to the first length.

* * * * *